(12) United States Patent
Karpov et al.

(10) Patent No.: US 10,090,461 B2
(45) Date of Patent: Oct. 2, 2018

(54) OXIDE-BASED THREE-TERMINAL RESISTIVE SWITCHING LOGIC DEVICES

(71) Applicant: Intel Corporation, Santa Clara, CA (US)

(72) Inventors: Elijah V. Karpov, Santa Clara, CA (US); Prashant Majhi, San Jose, CA (US); Ravi Pillarisetty, Portland, OR (US); Brian S. Doyle, Portland, OR (US); Niloy Mukherjee, Portland, OR (US); Uday Shah, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/126,138

(22) PCT Filed: Jun. 26, 2014

(86) PCT No.: PCT/US2014/044439
§ 371 (c)(1),
(2) Date: Sep. 14, 2016

(87) PCT Pub. No.: WO2015/199706
PCT Pub. Date: Dec. 30, 2015

(65) Prior Publication Data
US 2017/0148982 A1     May 25, 2017

(51) Int. Cl.
*H01L 47/00* (2006.01)
*H01L 45/00* (2006.01)

(52) U.S. Cl.
CPC ........ *H01L 45/1206* (2013.01); *H01L 45/085* (2013.01); *H01L 45/1226* (2013.01);
(Continued)

(58) Field of Classification Search
CPC ..... H01L 45/1206; H01L 45/08; H01L 45/10; H01L 45/1226; H01L 45/146;
(Continued)

(56) References Cited

U.S. PATENT DOCUMENTS

2003/0155602 A1* 8/2003 Krieger ................. B82Y 10/00
257/306
2004/0232497 A1* 11/2004 Akiyama ............ H01L 23/5223
257/390

(Continued)

FOREIGN PATENT DOCUMENTS

EP         2365554       9/2011
JP         2005-101535   4/2005
(Continued)

OTHER PUBLICATIONS

International Preliminary Report on Patentability for PCT Patent Application No. PCT/US2014/044439 dated Jan. 5, 2017, 9 pgs.
(Continued)

*Primary Examiner* — Benjamin Sandvik
*Assistant Examiner* — Herve Assouman
(74) *Attorney, Agent, or Firm* — Schwabe, Williamson & Wyatt, P.C.

(57) ABSTRACT

Oxide-based three-terminal resistive switching logic devices and methods of fabricating oxide-based three-terminal resistive switching logic devices are described. In a first example, a three-terminal resistive switching logic device includes an active region disposed above a substrate. The active region includes an active oxide material region disposed directly between a metal source region and a metal drain region. The device also includes a gate electrode disposed above the active oxide material region. In a second example, a three-terminal resistive switching logic device includes an active region disposed above a substrate. The active region
(Continued)

includes a first active oxide material region spaced apart from a second oxide material region. The device also includes metal input regions disposed on either side of the first and second active oxide material regions. A metal output region is disposed between the first and second active oxide material regions.

11 Claims, 11 Drawing Sheets

(52) U.S. Cl.
CPC ............ *H01L 45/14* (2013.01); *H01L 45/142* (2013.01); *H01L 45/145* (2013.01); *H01L 45/146* (2013.01); *H01L 45/1675* (2013.01)

(58) Field of Classification Search
CPC .............. H01L 45/147; G11C 13/0007; G11C 13/0097; G11C 16/0466
USPC .................................................. 257/2–4, 536
See application file for complete search history.

(56) References Cited

U.S. PATENT DOCUMENTS

| | | | | |
|---|---|---|---|---|
| 2007/0052037 | A1* | 3/2007 | Luan | H01L 21/823821 257/369 |
| 2008/0146611 | A1* | 6/2008 | Moran | A61K 31/4709 514/314 |
| 2008/0149911 | A1* | 6/2008 | Karg | H01L 45/08 257/4 |
| 2008/0212359 | A1* | 9/2008 | Muraoka | G11C 11/5685 365/148 |
| 2009/0001348 | A1 | 1/2009 | Kaeriyama et al. | |
| 2009/0026433 | A1* | 1/2009 | Chiang | G11C 11/5685 257/2 |
| 2009/0146242 | A1* | 6/2009 | Chen | H01L 45/00 257/506 |
| 2010/0163823 | A1* | 7/2010 | Sim | G11C 11/5685 257/2 |
| 2010/0246240 | A1 | 9/2010 | Nakaya | |
| 2011/0024715 | A1* | 2/2011 | Jo | B82Y 10/00 257/4 |
| 2011/0115049 | A1 | 5/2011 | Kim et al. | |
| 2011/0297912 | A1* | 12/2011 | Samachisa | G11C 13/003 257/5 |
| 2012/0268980 | A1* | 10/2012 | Awaya | G11C 13/0007 365/148 |
| 2012/0280224 | A1* | 11/2012 | Doolittle | C01G 33/00 257/43 |
| 2013/0026969 | A1* | 1/2013 | Kim | A61N 1/3785 320/103 |
| 2013/0168628 | A1* | 7/2013 | Hwang | H01L 45/06 257/1 |
| 2014/0072836 | A1* | 3/2014 | Mills | C25B 1/04 429/8 |
| 2014/0146592 | A1 | 5/2014 | Karpov et al. | |
| 2014/0175371 | A1 | 6/2014 | Karpov et al. | |
| 2014/0184172 | A1* | 7/2014 | Momo | H02J 7/0057 320/160 |

FOREIGN PATENT DOCUMENTS

| | | |
|---|---|---|
| JP | 2008-072031 | 3/2008 |
| JP | 2008235704 | 10/2008 |
| JP | 2010-534941 | 2/2015 |
| WO | WO-2008149808 | 12/2008 |

OTHER PUBLICATIONS

Non-Final Office Action and Search Report for Taiwan Patent Application No. 104115885 dated Apr. 15, 2016, 9 pgs.
Non-Final Office Action and Search Report for Taiwan Patent Application No. 104115885 dated Oct. 24, 2016, 7 pgs.
International Search Report and Written Opinion for PCT Patent Application No. PCl/US2014/044439 dated Mar. 24, 2015, 12 pgs.
Borodovsky, Yan, "Complementary Lithography at Insertion and Beyond", Semicon West 2012, Jun. 11, 2012, San Francisco, CA, USA, 30 pgs.
European Search Report from European Patent Application No. 14895579.2, dated Jan. 16, 2018, 8 pages.
Hyun-Tak, Kim et al. "Mechanism and observation of Mott transition in VO2-based two-and three-terminal devices; Mechanism and observation of Mott transition in VO2s-based two- and three-terminal devices," New Journal of Physics, Institute of Physics Publishing, Bristol GB, vol. 6, No. 1, May 1, 2004.
Office Action for Japanese Patent Application No. 2016-567791, dated Jul. 24, 2018, 7 pages.

* cited by examiner

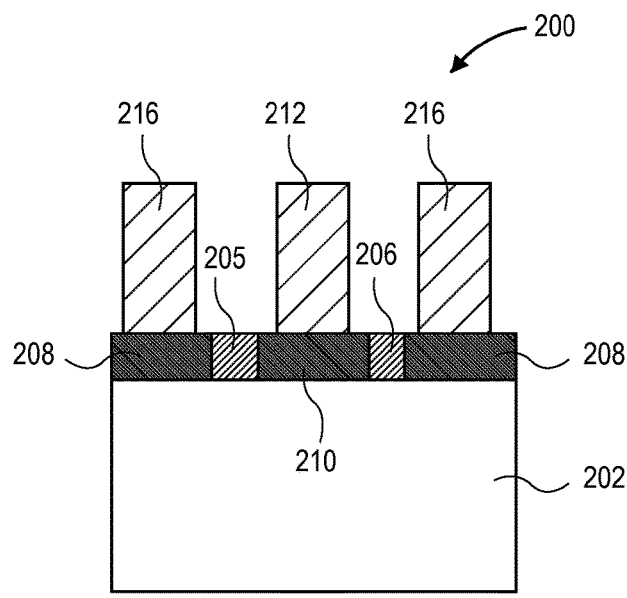
FIG. 4A
| 400 | | |
|---|---|---|
| Input1 | Input2 | Output1 |
| 0V | 0V | 0V |
| 1V | 0V | 1V |
| 0V | 1V | 1V |
| 1V | 1V | 1V |
FIG. 4B
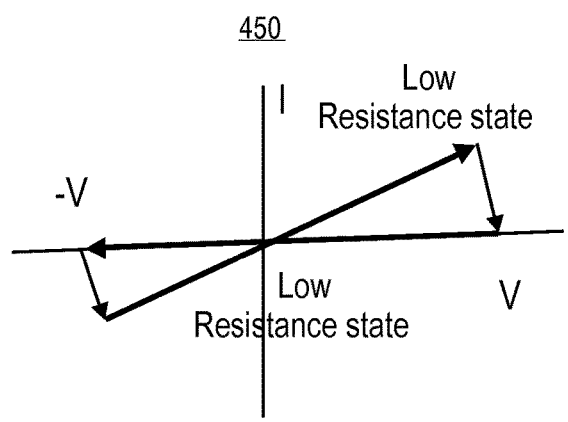
FIG. 4C

OXIDE-BASED THREE-TERMINAL RESISTIVE SWITCHING LOGIC DEVICES

CLAIM OF PRIORITY

This patent application is a U.S. National Phase application under 35 U.S.C. § 371 of International Application No. PCT/US2014/044439, filed Jun. 26, 2014, entitled "OXIDE-BASED THREE-TERMINAL RESISTIVE SWITCHING LOGIC DEVICES," the entire contents of which are incorporated herein by reference.

TECHNICAL FIELD

Embodiments of the invention are in the field of logic devices and, in particular, oxide-based three-terminal resistive switching logic devices and methods of fabricating oxide-based three-terminal resistive switching logic devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change, known as RRAM/ReRAM, typically operates at voltages greater than 1V, typically requires a high voltage (>1V) forming step to form a filament, and typically have high resistance values limiting read performance.

For low voltage non-volatile embedded applications, operating voltages less than 1V may be desirable or advantageous. Furthermore, compatibility with CMOS logic processes may be desirable or advantageous. Thus, significant improvements are still needed in the area of non-standard device manufacture and operation.

BRIEF DESCRIPTION OF THE DRAWINGS

FIGS. 4A-4C demonstrate operational considerations for the oxide-based three-terminal resistive switching logic device of FIG. 2, in accordance with an embodiment of the present invention.

DESCRIPTION OF THE EMBODIMENTS

Figure 1:
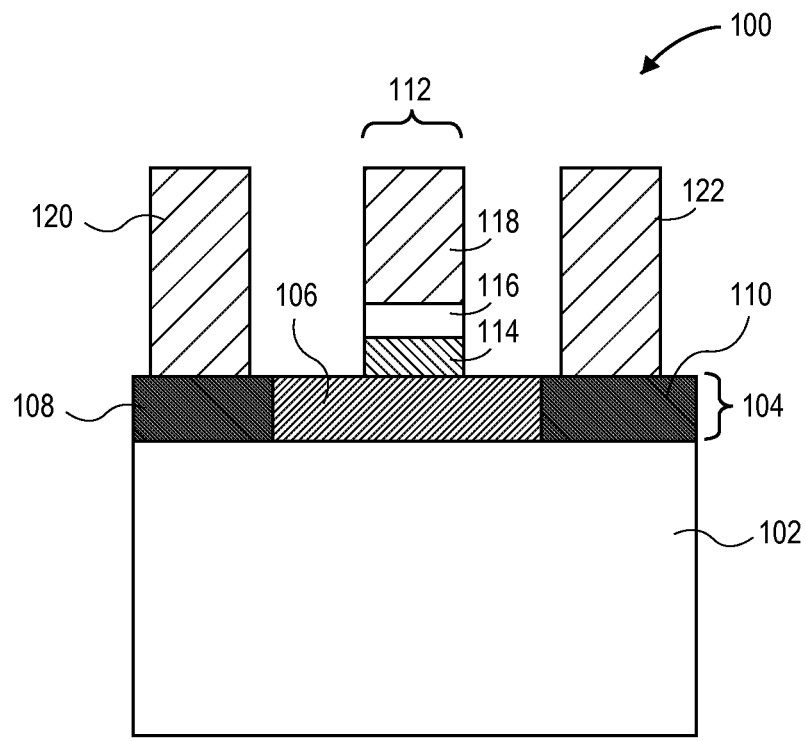
FIG. 1 illustrates a cross-sectional view of an oxide-based three-terminal resistive switching logic device, in accordance with an embodiment of the present invention.

Oxide-based three-terminal resistive switching logic devices and methods of fabricating oxide-based three-terminal resistive switching logic devices are described. In the following description, numerous specific details are set forth, such as specific device architectures and conductive/resistive oxide material regimes, in order to provide a thorough understanding of embodiments of the present invention. It will be apparent to one skilled in the art that embodiments of the present invention may be practiced without these specific details. In other instances, well-known features, such as completed integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to three-terminal resistive switching logic devices based on an oxide active material. The oxide active material is often referred to as a conductive oxide material, but may also be referred to as a resistive oxide material. Either way, principles described herein are based on the ability of such oxide materials to have different resistive states, which may be viewed as more resistive versus less resistive or more conductive versus less conductive. Such logic devices may be suitable as front-end devices or back end devices, and may be compatible with memory elements based on a same or similar oxide material. Applications of such logic devices may include, but are not limited to wearable electronics, classic logic technology application, or system-on chip (SoC) applications. In accordance with an embodiment of the present invention, device structures and fabrication schemes are provided herein to enable non-silicon-based logic devices and architectures.

To provide context, state-of-the-art logic devices are presently fabricated in a single crystalline silicon layer that is part of or is included on a top surface of a silicon wafer. In order to continue to drive along Moore's law and in order to increase the number of logic elements per unit area, additional logic devices may need to be fabricated above the conventional silicon device location, i.e., in regions typically associated with back-end of line (BEOL) silicon processing. In another aspect, logic devices may need to be fabricated on flexible non-silicon substrates, e.g., for considered for wearable products. However, current state of the art logic devices cannot readily be fabricated in BEOL layers or on flexible substrates.

Addressing such issues, one or more embodiments described herein involve the fabrication and of use oxide based devices. Oxide based devices are commonly used in two-terminal configurations and are based on the physics of resistive switching. Herein, three-terminal devices and methods of fabricating such three-terminal devices are described.

In a first example, FIG. 1 illustrates a cross-sectional view of an oxide-based three-terminal resistive switching logic device, in accordance with an embodiment of the present invention.

Referring to FIG. 1, an oxide-based three-terminal resistive switching logic device 100 includes an active region 104 formed above a substrate 102. The active region 104 includes an active oxide material region 106 disposed between a metal source region 108 and a metal drain region 110. A gate electrode 112 is disposed above the active oxide material region 106. In an embodiment, the gate electrode 112 includes a gate dielectric layer 114, a work-function electrode layer 116 (which may act as a diffusion barrier), and a gate contact 118, as is depicted in FIG. 1. A source contact 120 and a drain contact 122 may also be included, as is depicted in FIG. 1.

Figure 2:
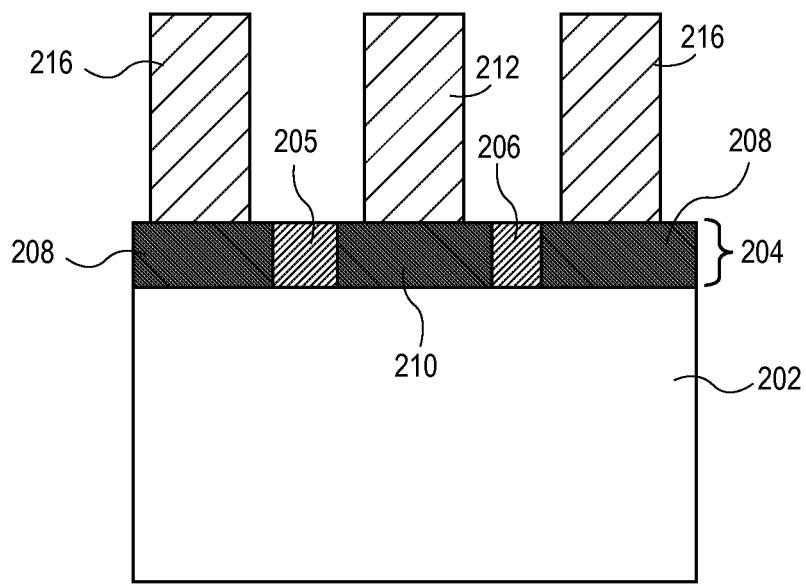
FIG. 2 illustrates a cross-sectional view of another oxide-based three-terminal resistive switching logic device, in accordance with another embodiment of the present invention.

In a second example, FIG. 2 illustrates a cross-sectional view of another oxide-based three-terminal resistive switching logic device, in accordance with another embodiment of the present invention.

Referring to FIG. 2, an oxide-based three-terminal resistive switching logic device 200 includes an active region 204 formed above a substrate 202. The active region 204 includes a first active oxide material region 205 and a second oxide material region 206. Metal input regions 208 are disposed on either side of the first and second active oxide material regions 205 and 206. A metal output region 210 is disposed between the first and second active oxide material regions 205 and 206. Input terminals 216 are coupled to the metal input regions 208. An output terminal 212 is coupled to the metal output region 210.

Referring again to FIGS. 1 and 2, in an embodiment, substrate 102 or 202 is an immediately underlying substrate, such as a silicon or glass substrate or a flexible organic or polymeric substrate. In other embodiments, substrate 102 or 202 represents a back end layer disposed above a conventional substrate. For example, in one embodiment, devices 100 or 200 are formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures 100 or 200 depicted above may be fabricated on underlying lower level back end of line (BEOL) interconnect layers.

Referring again to FIGS. 1 and 2, in an embodiment, active oxide material regions 106, 205 or 206 are composed of a conductive oxide material. In one such embodiment, the conductive oxide material is an anionic-based conductive oxide material, examples of which may include but are not limited to oxides of, W, V, Cr, or Ir, multi-component oxides such as Tin doped Indium oxide, as well as sub-stoichiometric oxides which can be described as AOx where A is a metal. Other examples are provided below in association with FIGS. 7 and 8. In another embodiment, the conductive oxide material is a cationic-based conductive oxide material, examples of which may include but are not limited to $LiMnO_2$, $Li_4TiO_{12}$, $LiNiO_2$, $LiNbO_3$, $Li_3N{:}H$, $LiTiS_2$, Na β-alumina, AgI, $RbAg_4I_5$, or $AgGeAsS_3$. Other examples are provided below in association with FIGS. 9 and 10.

Referring again to FIGS. 1 and 2, in an embodiment, metal source region 108, metal drain region 110, metal input regions 208, or metal output region 210 is composed of a metal such as, but not limited to, palladium (Pd), tungsten (W) or platinum (Pt).

Referring again to FIGS. 1 and 2, in an embodiment, gate contact 118, source contact 120, drain contact 122, output terminal 212, or input terminals 216 are composed of a conductive material. The conductive material may be a pure metal, such as tungsten, nickel, or cobalt, or may be an alloy such as a metal-metal alloy or a metal-semiconductor alloy (e.g., such as a silicide material).

Referring again to FIG. 1, the gate dielectric layer 114 is composed of a high-K material. For example, in one embodiment, the gate dielectric layer 114 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof.

Referring again to FIG. 1, in the case that a work-function electrode layer 116 is included, in an embodiment, the work-function electrode layer 116 is composed of a metal. In one embodiment, the work-function electrode layer 116 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. The layer also acts as diffusion barrier between gate oxide and electrode material.

In another aspect, devices 100 and 200 can be used in a three-terminal operation manner. For example, in one embodiment, devices 100 and 200 can be used to execute logic functions in front end and/or back end applications, or for wearables applications. Such three-terminal functionality may be described as resistive switching (RS) oxide based three-terminal logic functionality.

Figure 3A:
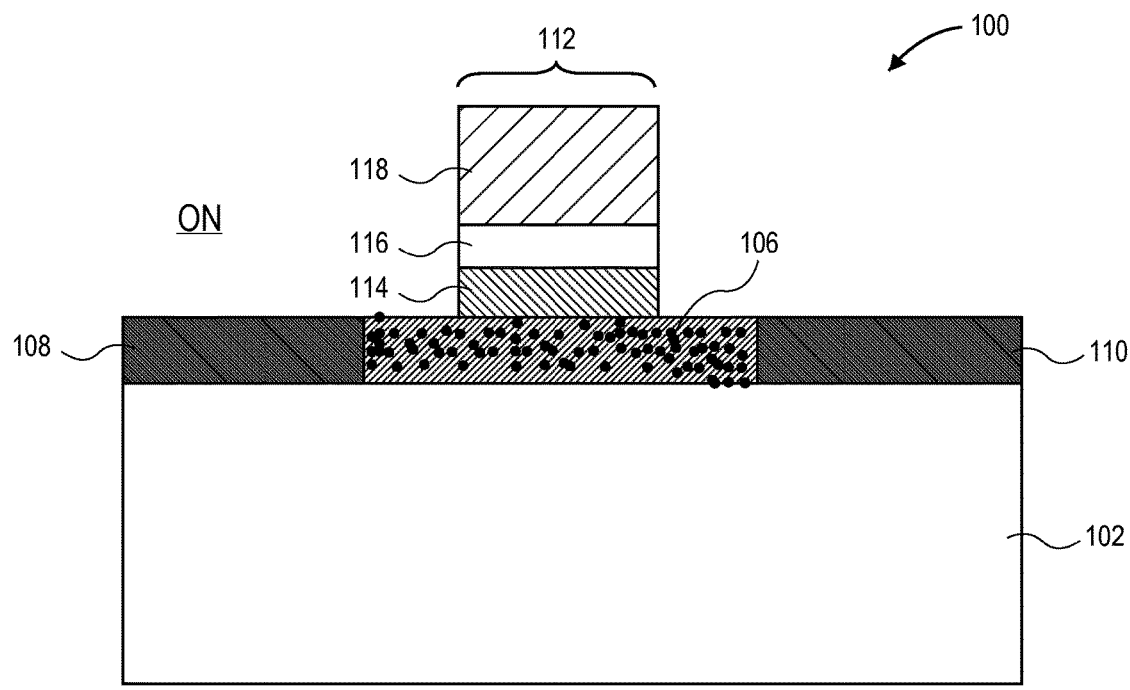
FIG. 3A illustrates a cross-sectional view representing an ON state of the oxide-based three-terminal resistive switching logic device of FIG. 1, in accordance with an embodiment of the present invention.
Figure 3B:
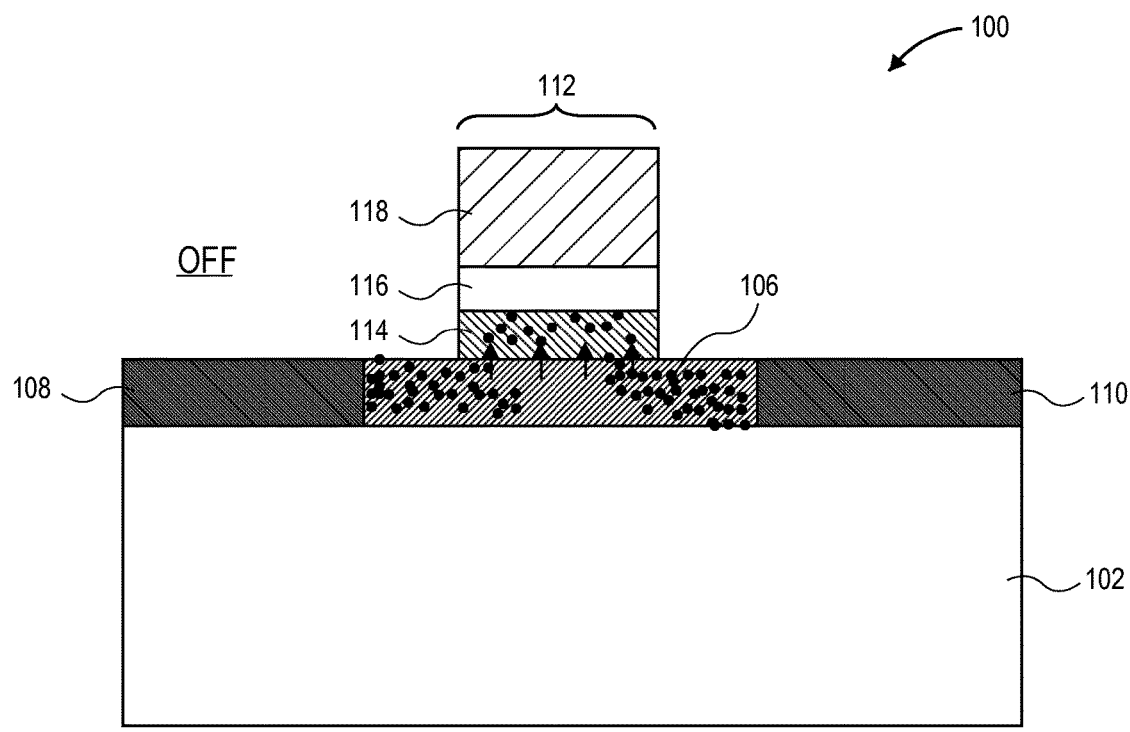
FIG. 3B illustrates a cross-sectional view representing an OFF state of the oxide-based three-terminal resistive switching logic device of FIG. 1, in accordance with an embodiment of the present invention.

In a first example, FIGS. 3A and 3B illustrate cross-sectional views representing ON and OFF states, respectively, of the oxide-based three-terminal resistive switching logic device of FIG. 1, in accordance with an embodiment of the present invention.

Referring to FIGS. 3A and 3B, the three terminal device 100 operates based on the interfacial switching phenomena commonly observed for two terminal resistive switching (RS) devices. Resistive switching involves field induced migration of oxygen vacancies due to an applied gate voltage (Vg). A gate oxide or dielectric can be dielectric-stack engineered to allow field induced oxygen vacancy drift, while maintaining low gate leakage. In this way, high Ion/Ioff may be realized at low Vcc can be realized for devices by appropriate choice of conductive/resistive oxide/ stacks and source/gate/drain materials. Referring specifically to FIG. 3A, in the ON state, a gate dielectric oxide 114 exchanges oxygen vacancies with the active oxide channel 106 when a bias is applied by the gate electrode 112. The active oxide is conductive when vacancy concentration is sufficient to enable a conduction path between source and drain. Referring specifically to FIG. 3B, the gate dielectric oxide 114 in this case is engineered to provide high electric field at the top of the channel when a bias is applied to the gate stack. The active oxide is resistive when vacancy concentration of vacancies is sufficiently reduced to disable a conduction path between source and drain. In a second example, FIGS. 4A-4C demonstrate operational considerations for the oxide-based three-terminal resistive switching logic device of FIG. 2, in accordance with an embodiment of the present invention.

Referring to FIG. 4A, device 200 is shown with the two active oxide regions each providing a resistive switch. With two switches in a device a truth Table 400 can be derived based on voltages applied to inputs 1 and 2 (inputs 216 of device 200) and output 1 (output 212 of device 200). Plot 450 represents IV characteristics for resistive switching based on applied voltages.

Figure 5:
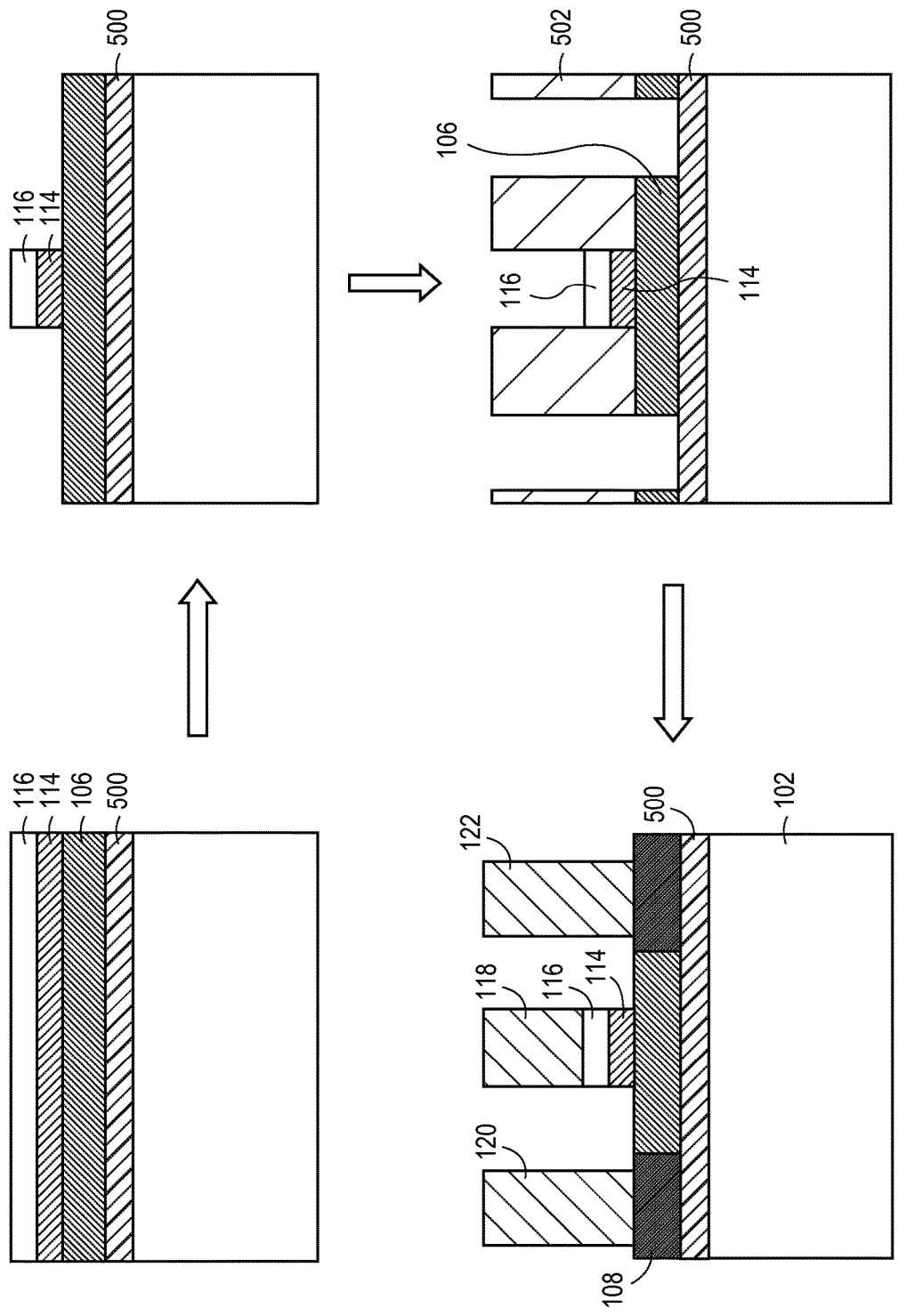
FIG. 5 illustrates cross-sectional view representing various operations in a method of fabricating an oxide-based three-terminal resistive switching logic device of the type of FIG. 1, in accordance with an embodiment of the present invention.

In another aspect, FIG. 5 illustrates cross-sectional view representing various operations in a method of fabricating an oxide-based three-terminal resistive switching logic device of the type of FIG. 1, in accordance with an embodiment of the present invention.

Referring to FIG. 5, a starting material stack includes an active oxide material layer 106 disposed above a substrate. A gate dielectric layer 114 is disposed on the active oxide material layer 106. A work-function electrode layer 116 is disposed on the gate dielectric layer 114. Optionally, an isolation layer 500 is disposed between the active oxide material layer 106 and an underlying substrate, as is depicted in FIG. 5. In a next processing operation, the work-function electrode layer 116 and the gate dielectric layer 114 are etched to pattern these layers. In a next processing operation, an interlayer dielectric layer (ILD) 502 is deposited and patterned by etching to provide openings exposing the patterned work-function electrode layer 116 and the gate dielectric layer 114, in addition to portions of the active oxide material layer 106. In a next portion of the processing scheme, a metal source region 108 and a metal drain region 110, as well as electrodes 118, 120 and 122 are formed, e.g., by metal deposition and chemical mechanical planarization (CMP). The device type of FIG. 1 may thus be obtained in a processing scheme involving patterning of an active oxide material layer. The ILD layer 502 may be removed as a sacrificial layer or may be retained.

Figure 6A:
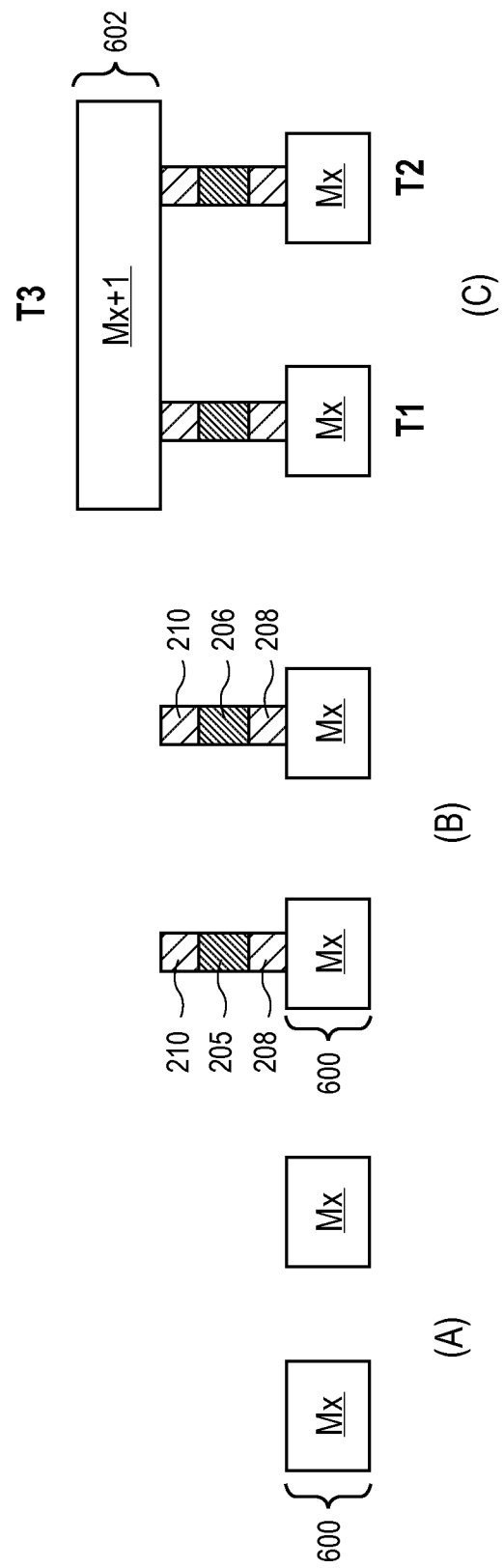
FIG. 6A illustrates cross-sectional view representing various operations in a first method of fabricating an oxide-based three-terminal resistive switching logic device of the type of FIG. 2, in accordance with an embodiment of the present invention.

In another example, FIG. 6A illustrates cross-sectional view representing various operations in a first method of fabricating an oxide-based three-terminal resistive switching logic device of the type of FIG. 2, in accordance with an embodiment of the present invention.

Referring to FIG. 6A, a two-metal layer scheme involves (A) forming first metal line structures 600, e.g., metal lines (Mx) in a back end of line semiconductor die metallization layer. In (B), on the left-hand side, a material stack including a metal input region 208, a first active oxide region 205 and a first portion of a metal output region 210 is formed. On the right-hand side, a material stack including a metal input region 208, a second active oxide region 206 and a second portion of a metal output region 210 is formed. Referring to (C), an upper metal line 602 (Mx+1) is formed on the stack formed in (B). The result is a version of the device type of FIG. 2, with input terminals T1 and T2 and output terminal T3, as depicted in FIG. 6A. In one embodiment, the 208 and 210 electrode materials can be different, e.g. different work-function.

Figure 6B:
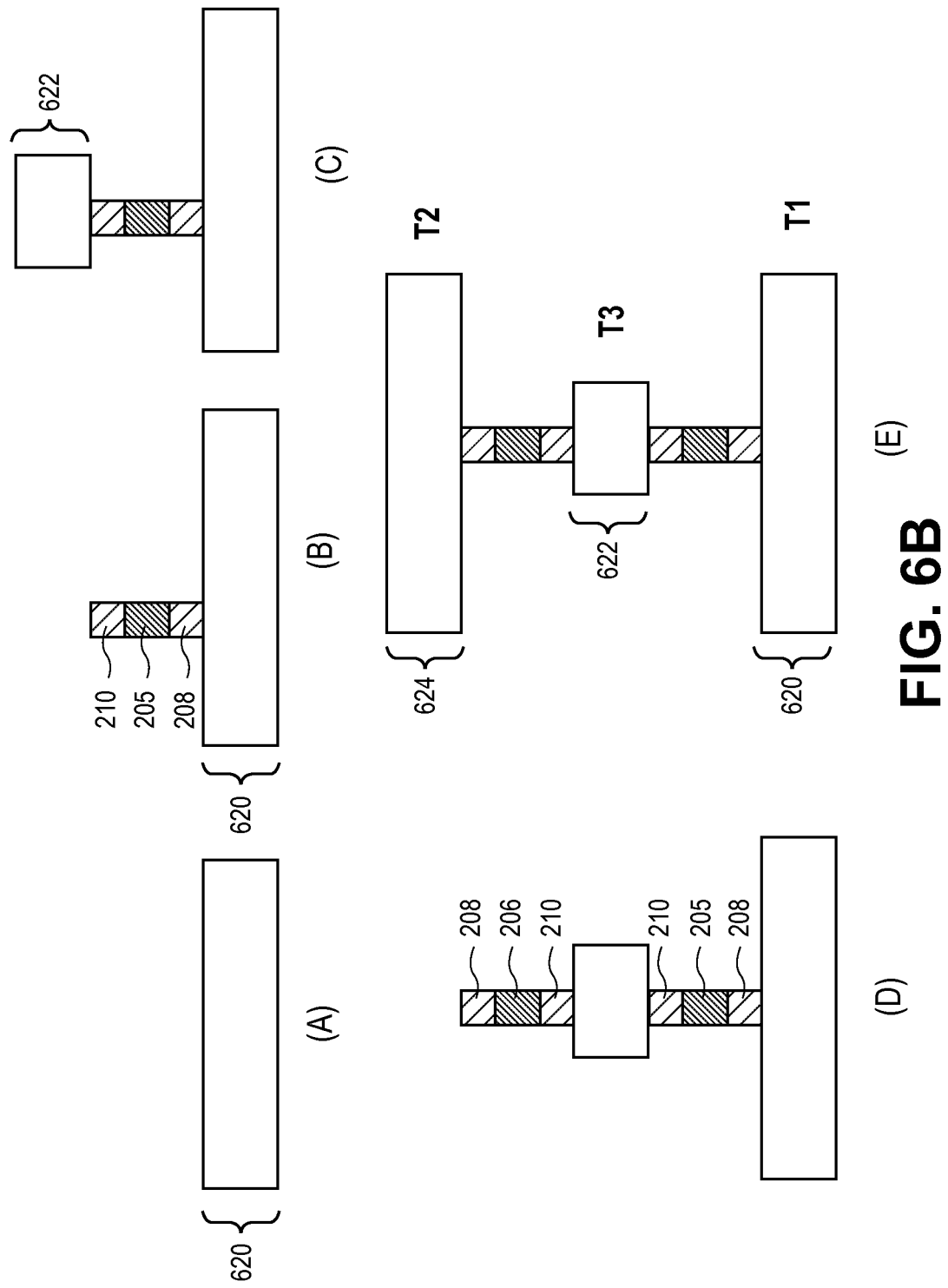
FIG. 6B illustrates cross-sectional view representing various operations in a second method of fabricating an oxide-based three-terminal resistive switching logic device of the type of FIG. 2, in accordance with an embodiment of the present invention.

In another example, FIG. 6B illustrates cross-sectional view representing various operations in a second method of fabricating an oxide-based three-terminal resistive switching logic device of the type of FIG. 2, in accordance with an embodiment of the present invention.

Referring to FIG. 6B, a three-metal layer vertical scheme involves (A) forming a first metal line structure 620, e.g., a metal line in a back end of line semiconductor die metallization layer. In (B), a material stack including a metal input region 208, a first active oxide region 205 and a first portion of a metal output region 210 is formed. In (C), a second, middle, metal line structure 622 is formed on the stack formed in (B). In (D), a material stack including a second portion of a metal output region 210, a second active oxide region 206, and a metal input region 208 is formed. Referring to (E), an upper metal line 624 is formed on the stack formed in (D). The result is a version of the device type of FIG. 2, with input terminals T1 and T2 and output terminal T3, as depicted in FIG. 6B.

Figure 6C:
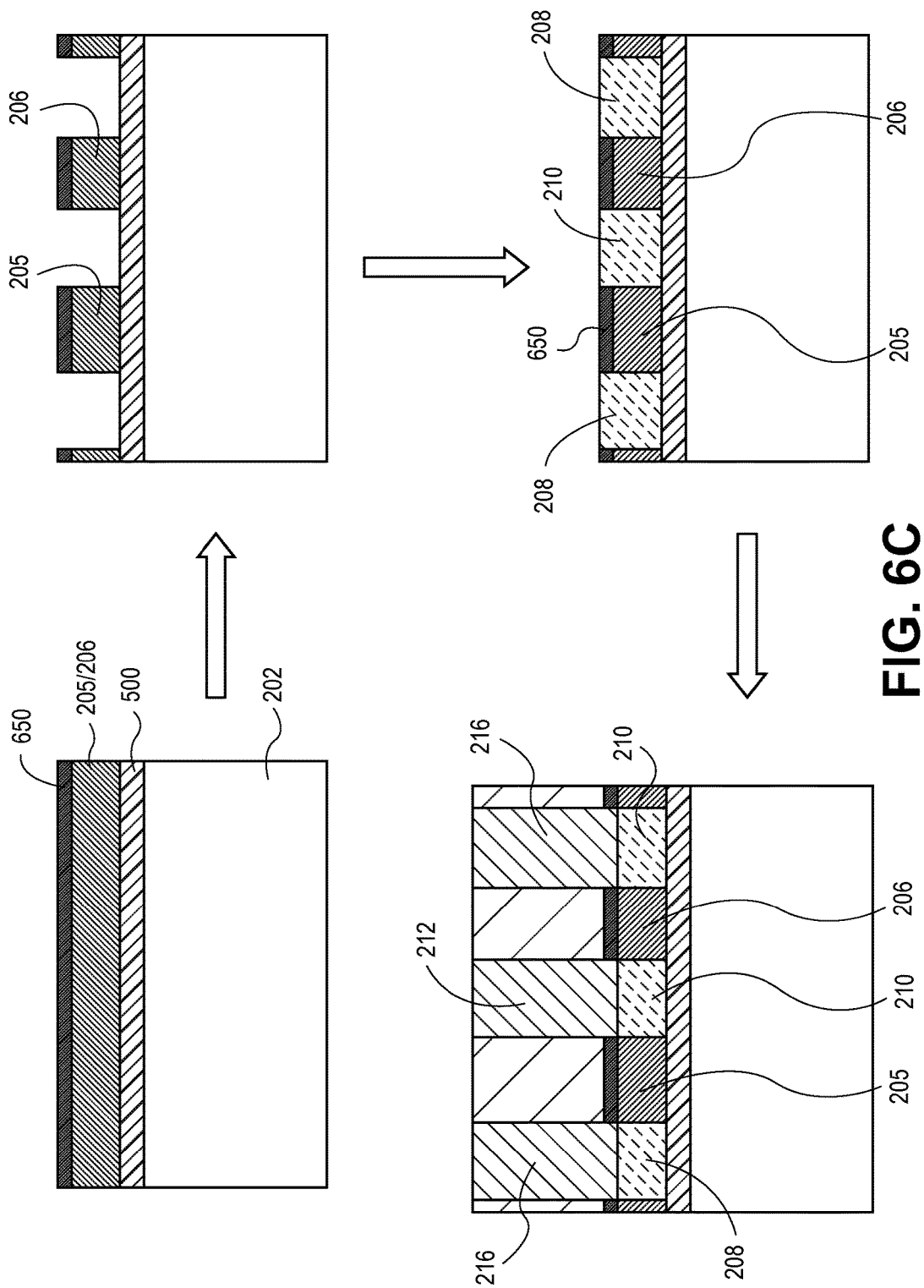
FIG. 6C illustrates cross-sectional view representing various operations in a third method of fabricating an oxide-based three-terminal resistive switching logic device of the type of FIG. 2, in accordance with an embodiment of the present invention.

In another example, FIG. 6C illustrates cross-sectional view representing various operations in a third method of fabricating an oxide-based three-terminal resistive switching logic device of the type of FIG. 2, in accordance with an embodiment of the present invention.

Referring to FIG. 6C, a lateral integration scheme involves a starting material stack that includes an active oxide material layer 205/206 disposed above a substrate. A barrier layer 650, such as a silicon nitride barrier layer, is optionally disposed on the active oxide material layer 205/ 206. Optionally, an isolation layer 500 is disposed between the active oxide material layer 205/206 and an underlying substrate, as is depicted in FIG. 6C. In a next processing operation, the active oxide material layer 205/206 is patterned by etching. In a next processing operation, metal input 208 and metal output 210 regions are formed in the patterned active oxide material layer 205/206, forming first and second active oxide material regions 205 and 206, respectively. In a next portion of the processing scheme, input terminals 216 and output terminal 212 are formed. Electrodes 118, 120 and 122 are also formed, e.g., by metal deposition and chemical mechanical planarization (CMP). The result is a version of the device type of FIG. 2, with input terminals 216 and output terminal 212, as depicted in FIG. 6C. In one embodiment, middle 210 electrode material can be different from 208, e.g. different workfunction.

In another aspect, it is to be appreciated that the above described oxide-based three-terminal resistive switching logic devices may be integrated along with low voltage embedded memory for material and processing compatibility. For example, the above described oxide-based three-terminal resistive switching logic devices may be integrated along with memory based on conductive oxide and electrode stacks. In one or more embodiments, the structural architecture of each such memory element in an array is based on a junction-free arrangement, in that a non-conducting layer is not used in the functional element of the memory stack. More specifically, in an embodiment, a metal-conductive oxide-metal (MCOM) structure is implemented to fabricate a resistance change memory (often referred as RRAM) based architecture, e.g., instead of a metal-dielectric (insulating) oxide-metal (MIM) based structure. Since all layers in such memory elements are conductors, the arrangement enables one or more of the following: (1) low voltage operation, e.g., less than 1 Volt operation; (2) elimination of the need for a one time high voltage, commonly called forming voltage, required for state of the art RRAM; and (3) low resistances (e.g., since all components are conductors) which can provide for fast read in operation of the memory device.

Figure 7:
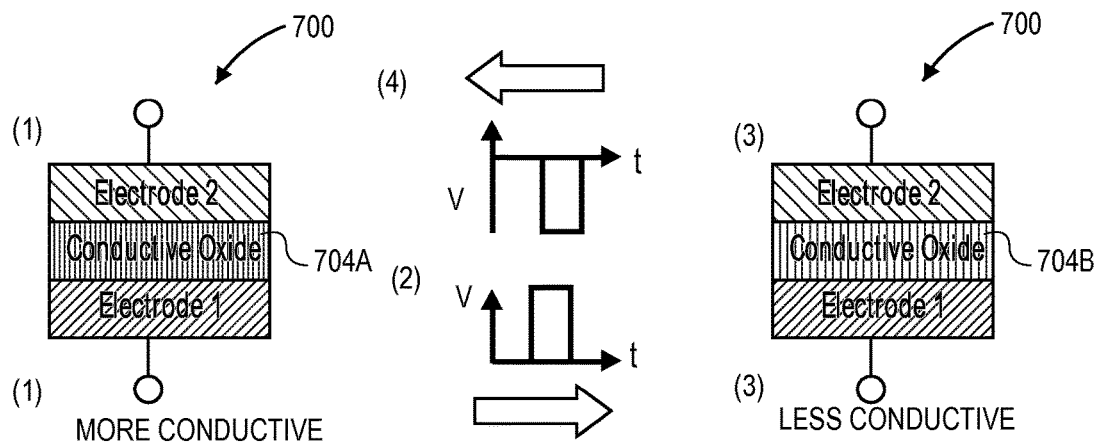
FIG. 7 illustrates an operational schematic representing a changing of states for an anionic-based metal-conductive oxide-metal (MCOM) memory element, in accordance with an embodiment of the present invention.

As a first example, an individual memory element that may be compatible for manufacture along with the above described oxide-based three-terminal resistive switching logic devices may be an anionic-based conductive oxide memory element. FIG. 7 illustrates an operational schematic representing a changing of states for an anionic-based metal-conductive oxide-metal (MCOM) memory element, in accordance with an embodiment of the present invention. Referring to FIG. 7, a memory element 700 includes an electrode/conductive oxide/electrode material stack. The memory element 700 may begin in a less conductive state (1), with the conductive oxide layer being in a less conductive state 704A. An electrical pulse, such as a duration of a positive bias (2) may be applied to provide memory element 700 in a more conductive state (3), with the conductive oxide layer being in a more conductive state 704B. An electrical pulse, such as a duration of a negative bias (4) may be applied to again provide memory element 700 having the less conductive state (1). Thus, electrical pulsing may be used to change resistance of the memory element 700.

As such, in an embodiment, a memory element includes an anionic-based conductive oxide layer sandwiched between two electrodes. Resistivity of the conductive oxide layer in low field (when device is read) is, in some embodiments, in the range found typical of conductive films of metal compounds, e.g. TiAlN. For example, in a specific embodiment, the resistivity for such a layer is approximately in the range of 0.1 Ohm cm-10 kOhm cm when measured at low field. Resistivity of the film is tuned depending in the memory element size to achieve final resistance value in the range compatible with fast read. Composition of the conductive oxide layer may be tuned in such a way that a small change in its composition results in a large change in resistance. Resistance change occurs, in some embodiments, due to a Mott transition, e.g., when injected/extracted charge causes phase transition in the conductive oxide layer between more and less resistive phase configurations. In other embodiments, the resistance change can be induced by changing the concentration of oxygen vacancies in the conductive oxide layer.

Figure 8:
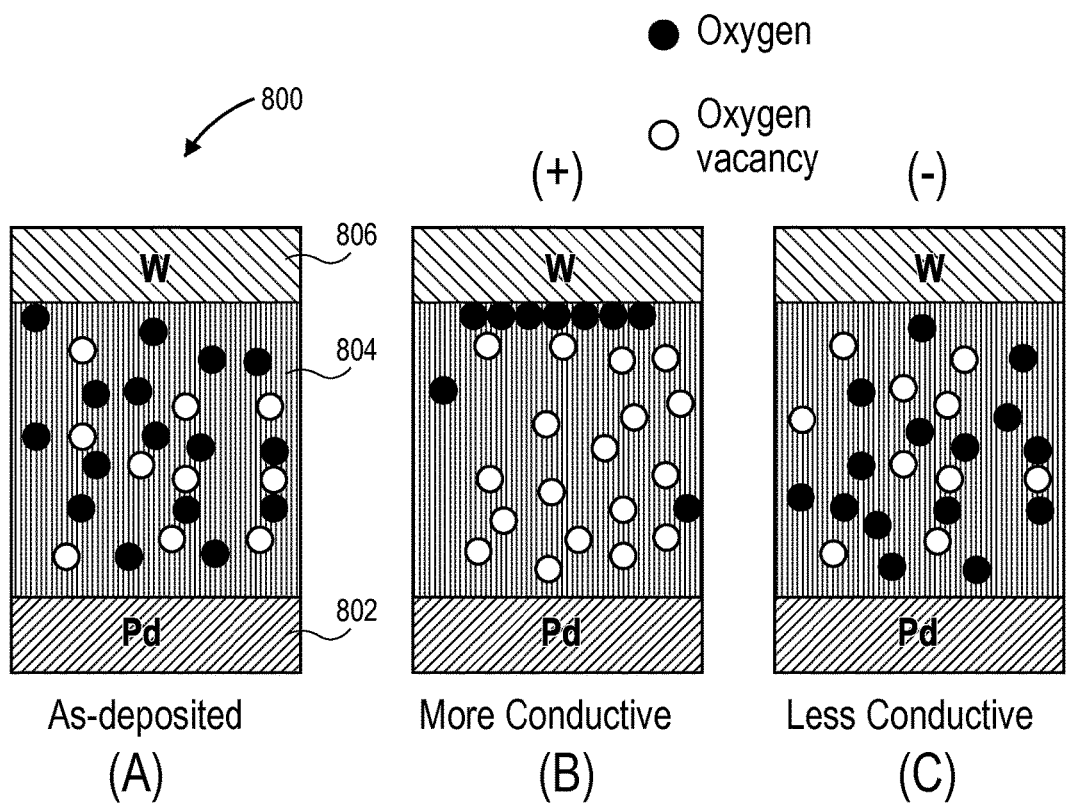
FIG. 8 illustrates a schematic representation of resistance change in a conductive oxide layer induced by changing the concentration of oxygen vacancies in the conductive oxide layer, in accordance with an embodiment of the present invention.

As an example of one approach, FIG. 8 illustrates a schematic representation of resistance change in an anionic-based conductive oxide layer induced by changing the concentration of oxygen vacancies in the conductive oxide layer, in accordance with an embodiment of the present invention. Referring to FIG. 8, a memory element 800 is shown as deposited (A). The memory element includes a conductive oxide layer 804 between a palladium (Pd) electrode 802 and a tungsten (W) electrode 806. Oxygen atoms and oxygen vacancies may be distributed as shown in (A). Referring to (B) of FIG. 8, upon application of a positive bias, the memory element 800 can be made more conductive. In that state, oxygen atoms migrate to the electrode 806, while vacancies remain throughout the layer 804. Referring to (C) of FIG. 8, upon application of a negative bias, the memory element can be made less conductive. That state, oxygen atoms are distributed more evenly throughout layer 804. Accordingly, in an embodiment, effective composition (e.g., the location of oxygen atoms versus vacancies) of a conductive oxide layer is modified to change resistance of a memory element. In a specific embodiment, an applied electrical field, which drives such compositional change, is tuned to values approximately in the range of 1e6-1e7 V/cm.

As mentioned briefly above, in an embodiment, one electrode in a memory element including an anionic-based conductive oxide layer is a noble metal based electrode, while the other electrode in is a transition metal for which some of the lower valence oxides are conductive (e.g., to act as an oxygen reservoir). That is, when oxygen atoms migrate to the transition metal oxide, the resulting interfacial transition metal oxide formed remains conductive. Examples of suitable transition metals which form conductive oxides include but are not limited to, W, V, Cr, or Ir. In other embodiments, one or both of the electrodes is fabricated from an electro-chromic material. In other embodiments, one or both of the electrodes is fabricated from a second, different conductive oxide material. In an embodiment, examples of suitable conductive oxides include, but are not limited to: ITO ($In_2O_{3-x}SnO_{2-x}$), $In_2O_{3-x}$, sub-stoichiometric yttria doped zirconia ($Y_2O_{3-x}ZrO_{2-x}$), or $La_{1-x}Sr_xGa_{1-y}Mg_yO_{3-X-0.5(x+y)}$. In another embodiment, the conductive oxide layer is composed of a material with two or more metal elements (e.g., as contrasted to common RRAM memories using one metal such as found in binary oxides, such as $HfO_x$ or $TaO_x$). In such ternary, quaternary, etc. alloys, the metals used are from adjacent columns of the periodic table. Specific examples of suitable such conductive oxides include, but are not limited to: Y and Zr in $Y_2O_{3-x}ZrO_{2-x}$, In and Sn in $In_2O_{3-x}SnO_{2-x}$, or Sr and La in $La_{1-x}Sr_xGa_{1-y}Mg_yO_3$. Such materials may be viewed as compositions selected to have aliovalent substitution to significantly increase the number of oxygen vacancies. Note, that in some embodiments the change of resistance of such electrode during programming can contribute to the total resistance change.

In an embodiment, examples of suitable noble metals include, but are not limited to Pd or Pt. In a specific embodiment, a more complex, yet still all-conductive, stack includes an approximately 10 nm Pd first electrode layer, an approximately 3 nm $In_2O_{3-x}$ and/or $SnO_{2-x}$ conductive oxide layer, and a second electrode stack composed of approximately 20 nm tungsten/10 nm Pd/100 nm TiN/55 nm W.

Figure 9:
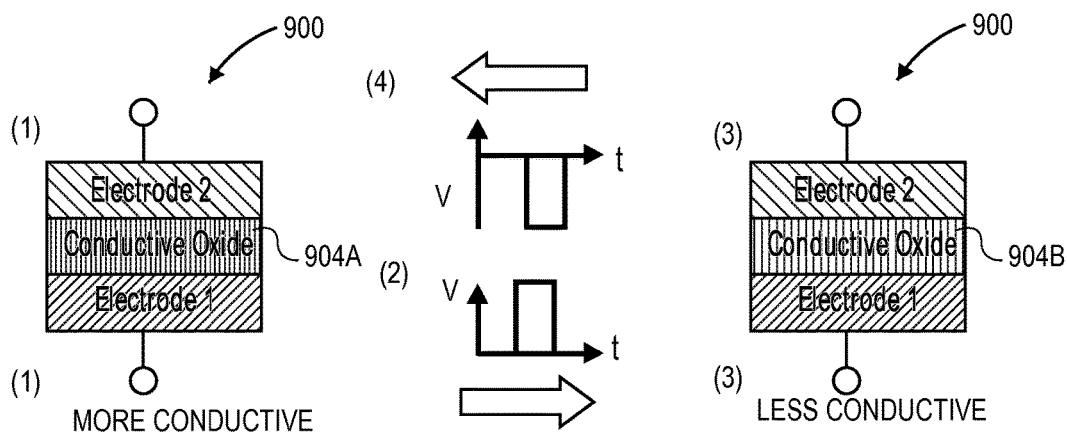
FIG. 9 illustrates an operational schematic representing a changing of states for a cationic-based metal-conductive oxide-metal (MCOM) memory element, in accordance with an embodiment of the present invention.

As a second example, an individual memory element that may be compatible for manufacture along with the above described oxide-based three-terminal resistive switching logic devices may be a cationic-based conductive oxide memory element. As an example, FIG. 9 illustrates an operational schematic representing a changing of states for a cationic-based metal-conductive oxide-metal (MCOM) memory element, in accordance with an embodiment of the present invention. Referring to FIG. 9, memory element 900 may begin in a more conductive state (1), with a cationic-based conductive oxide layer being in a more conductive state 904A. An electrical pulse, such as a duration of a positive bias (2) may be applied to provide memory element 900 in a less conductive state (3), with the cationic-based conductive oxide layer being in a less conductive state 904B. An electrical pulse, such as a duration of a negative bias (4) may be applied to again provide memory element 900 having the more conductive state (1). Thus, electrical pulsing may be used to change resistance of the memory element 900. Polarity applied is such as to attract active cations of in the memory layer to the intercalation electrode under negative bias.

As such, in an embodiment, a memory element includes a cationic-based conductive oxide layer sandwiched between two electrodes. Resistivity of the cationic-based conductive oxide layer in low field (when device is read) is, in some embodiments, can be as low as found typical of conductive films of metal compounds, e.g. TiAlN. For example, in a specific embodiment, the resistivity for such a layer is approximately in the range of 0.1 Ohm cm-10 kOhm cm when measured at low field (measured for the specific thickness used in the stack). Resistivity of the film is tuned depending in the memory element size to achieve final resistance value in the range compatible with fast read.

Figure 10:
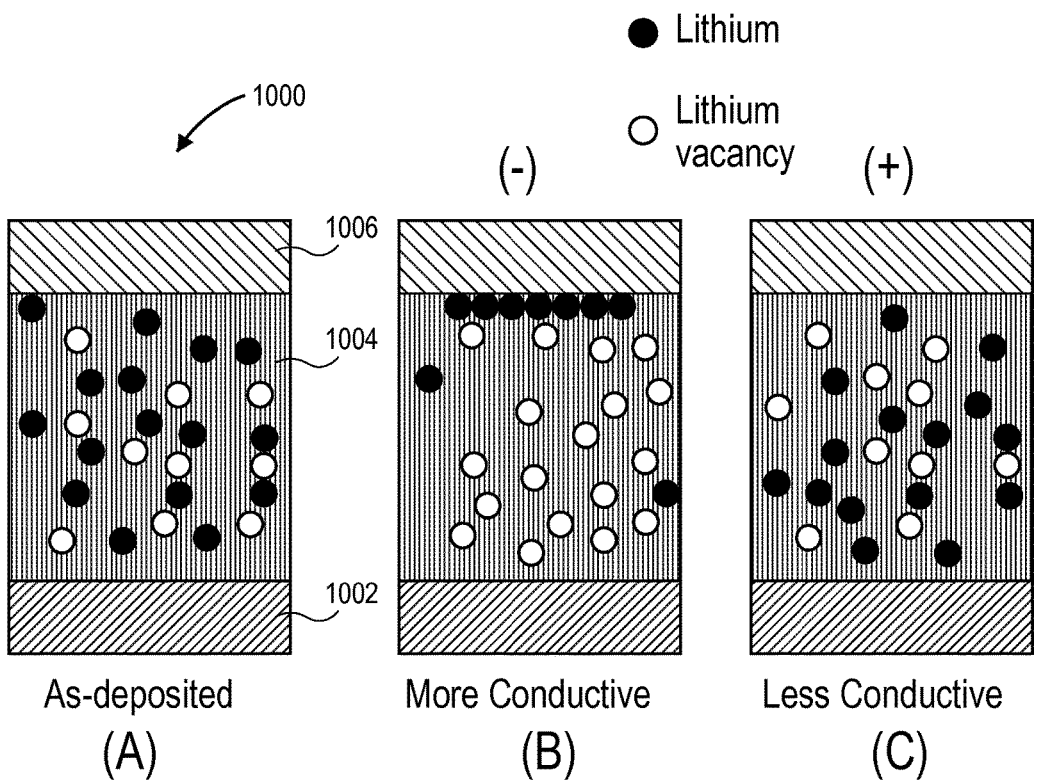
FIG. 10 illustrates a schematic representation of resistance change in a cationic-based conductive oxide layer induced by changing the concentration of cation vacancies in the conductive oxide layer, using an example of material with composition of $Li_xCO_{O2}$, in accordance with an embodiment of the present invention. In general, a more conductive state can have also more cations available in the solid electrolyte layer.

As an example of one approach, FIG. 10 illustrates a schematic representation of resistance change in a cationic-based conductive oxide layer induced by changing the concentration of cation vacancies (such as lithium cation vacancies) in the conductive oxide layer, in accordance with an embodiment of the present invention.

Referring to FIG. 10, a memory element 1000 is shown as deposited (A). The memory element includes a cationic-based conductive oxide layer 1004 between a bottom electrode 1002 and a top electrode 1006. In a specific example, the layer 1004 is a lithium cobalt oxide layer, described in greater details below, and lithium atoms and lithium vacancies are distributed as shown in (A). Referring to (B) of FIG. 10, upon application of a negative bias, the memory element 1000 can be made more conductive. In that state, lithium atoms migrate to the top electrode 1006, while vacancies remain throughout the layer 1004. Referring to (C) of FIG. 10, upon application of a positive bias to one of the electrodes, the memory element can be made less conductive. In that state, lithium atoms are distributed more evenly throughout layer 1004. Accordingly, in an embodiment, effective composition (e.g., the location of lithium atoms (or cations) versus vacancies) of a cationic-based conductive oxide layer is modified to change resistance of a memory element, in some embodiments due to stoichiometry-induced Mott transition. In a specific embodiment, an applied electrical field, which drives such compositional change during write operation, is tuned to values approximately in the range of 1e6-1e7 V/cm.

In an embodiment, referring again to FIG. 10, the cationic-based conductive oxide layer 1004 is composed of a material suitable for cation-based mobility within the layer itself. In a specific exemplary embodiment, layer 1004 of FIG. 10 part (A) is composed of lithium cobalt oxide ($LiCoO_2$). Then, in part (B), the corresponding layer becomes lithium deficient (e.g., $Li_{<0.75}CoO_2$) when a negative bias is applied and lithium atoms (e.g., as cations) migrate toward electrode 1006. By contrast, in part (C), the corresponding layer becomes lithium rich (e.g., $Li_{>0.95}CoO_2$) when a positive bias is applied and lithium atoms (e.g., as cations) migrate away from electrode 1006. In other embodiments, other suitable compositions with cationic conductivity include, but are not limited to, $LiMnO_2$, $Li_4Ti_5O_{12}$, $LiNiO_2$, $LiNbO_3$, $Li_3N{:}H$, $LiTiS_2$ (all of which are lithium atom or $Li^+$ mobility based), Na β-alumina (which is sodium atom or $Na^+$ mobility based), or AgI, $RbAg_4I_5$, $AgGeAsS_3$ (all of which are silver atom or $Ag^+$ mobility based). In general, these examples provide materials based on cation mobility or migration, which is typically much faster than anionic-based mobility or migration (e.g., for oxygen atoms or $O^{2-}$ anions).

In an embodiment, referring again to FIG. 10, one electrode (e.g., bottom electrode 1002) in a memory element including a cationic conductive oxide layer is a noble metal based electrode. In one embodiment, examples of suitable noble metals include, but are not limited to palladium (Pd) or platinum (Pt). In a specific embodiment, a memory stack includes a bottom electrode composed of an approximately 10 nanometer thick Pd layer. It is to be understood that use of the terms "bottom" and "top" for electrodes 1002 and 1006 need only be relative and are not necessarily absolute with respect to, e.g., an underlying substrate.

In an embodiment, referring again to FIG. 10, the other electrode (e.g., top electrode 1006) in a memory element including a cationic conductive oxide layer is an "intercalation host" for migrating cations. The material of the top electrode is a host in a sense that the material is conductive with or without the presence of the migrating cations and is not substantially altered in the absence or presence of the migrating cations. In an exemplary embodiment, the top electrode is composed of a material such as, but not limited to, graphite, or metal chalcogenides such as disulfides (e.g., $TaS_2$). Such materials are conductive as well as absorbing of cations such as $Li^+$. This is in contrast to an electrode for an anionic based conductive oxide which may include a metal with a corresponding conductive oxide to accommodate migrating oxygen atoms or anions.

Figure 11:
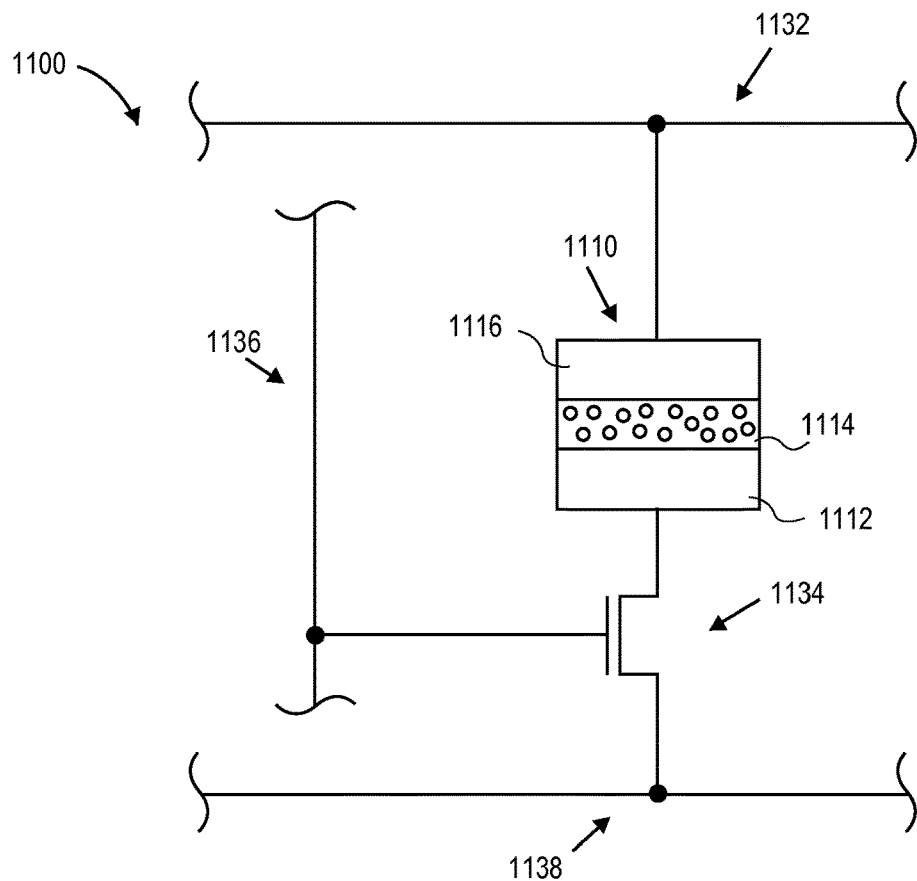
FIG. 11 illustrates a schematic of a memory bit cell which includes a metal-conductive oxide-metal (MCOM) memory element, in accordance with an embodiment of the present invention.

Referring again to the description associated with FIGS. 7-10 above, a stack of conductive layers including a conductive metal oxide layer may be used to fabricate as memory bit cell. For example, FIG. 11 illustrates a schematic of a memory bit cell 1100 which includes a metal-conductive oxide-metal (MCOM) memory element 1110, in accordance with an embodiment of the present invention. Such an MCOM memory element may be suitable for manufacture on a substrate in common with oxide-based three-terminal resistive switching logic devices such as those described above in association with FIGS. 1-6.

Referring to FIG. 11, the MCOM memory element 1110 may include a first conductive electrode 1112 with a conductive metal oxide layer 1114 adjacent the first conductive electrode 1112. A second conductive electrode 1116 is adjacent the conductive metal oxide layer 1114. The second conductive electrode 1116 may be electrically connected to a bit line 1132. The first conductive electrode 1112 may be coupled with a transistor 1134. The transistor 1134 may be coupled with a wordline 1136 and a source line 1138 in a manner that will be understood to those skilled in the art. The memory bit cell 1100 may further include additional read and write circuitry (not shown), a sense amplifier (not shown), a bit line reference (not shown), and the like, as will be understood by those skilled in the art, for the operation of the memory bit cell 1100. It is to be understood that a plurality of the memory bit cells 1100 may be operably connected to one another to form a memory array (e.g., as shown in, and described in association with, FIGS. 3, 4A and 4B), wherein the memory array can be incorporated into a non-volatile memory device. It is to be understood that the transistor 1134 may be connected to the second conductive electrode 1116 or the first conductive electrode 1112, although only the latter is shown.

Figure 12:
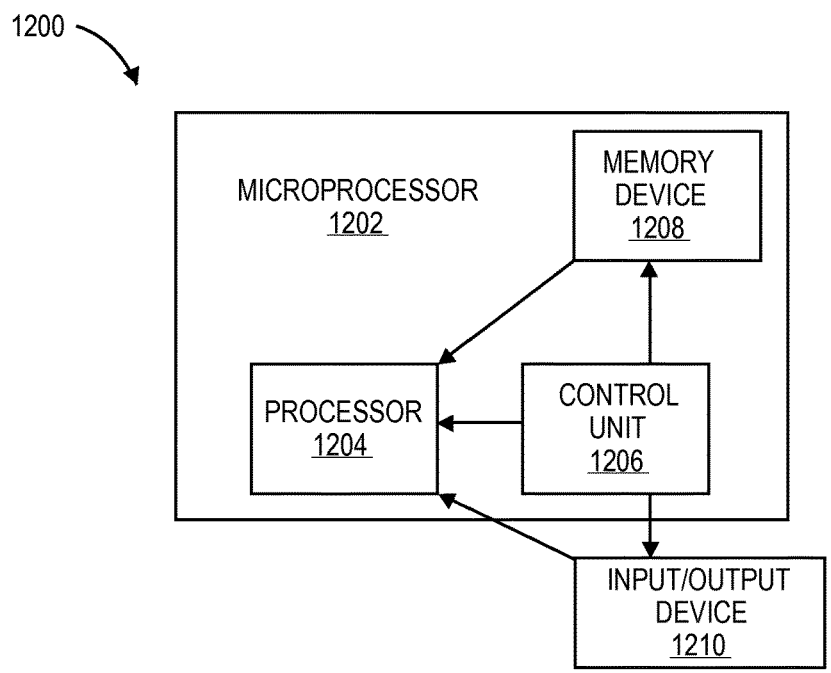
FIG. 12 illustrates a block diagram of an electronic system, in accordance with an embodiment of the present invention.

FIG. 12 illustrates a block diagram of an electronic system 1200, in accordance with an embodiment of the present invention. The electronic system 1200 can correspond to, for example, a portable system, a computer system, a process control system, or any other system that utilizes a processor and an associated memory. The electronic system 1200 may include a microprocessor 1202 (having a processor 1204 and control unit 1206), a memory device 1208, and an input/output device 1210 (it is to be understood that the electronic system 1200 may have a plurality of processors, control units, memory device units and/or input/output devices in various embodiments). In one embodiment, the electronic system 1200 has a set of instructions that define operations which are to be performed on data by the processor 1204, as well as, other transactions between the processor 1204, the memory device 1208, and the input/output device 1210. The control unit 1206 coordinates the operations of the processor 1204, the memory device 1208 and the input/output device 1210 by cycling through a set of operations that cause instructions to be retrieved from the memory device 1208 and executed. The memory device 1208 can include a memory element having a conductive oxide and electrode stack as described in the present description. In an embodiment, the memory device 1208 is embedded in the microprocessor 1202, as depicted in FIG. 12. In an embodiment, the processor 1204, or another component of electronic system 1200, includes an array of oxide-based three-terminal resistive switching logic devices.

Figure 13:
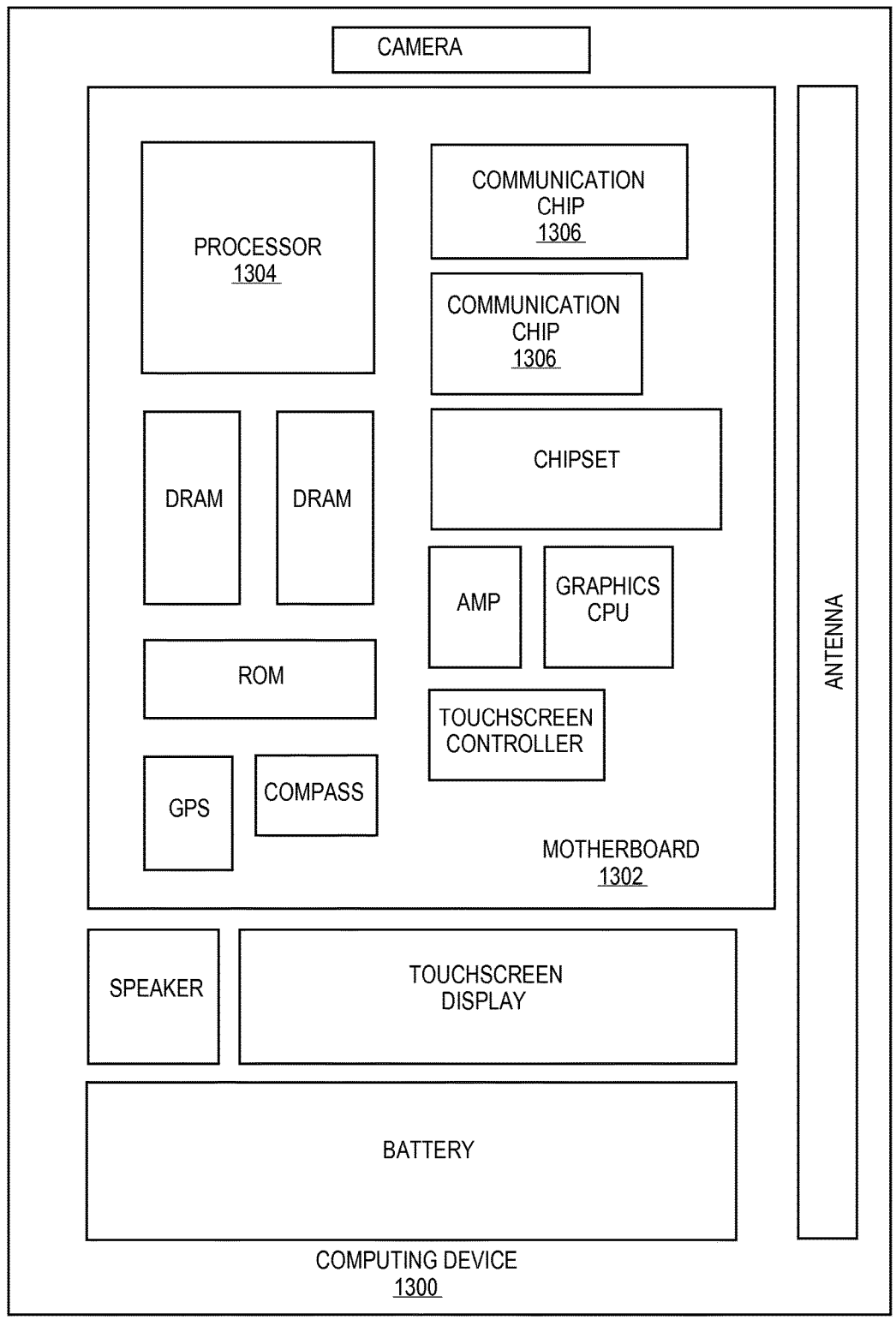
FIG. 13 illustrates a computing device in accordance with one implementation of the invention.

FIG. 13 illustrates a computing device 1300 in accordance with one implementation of the invention. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the invention, the integrated circuit die of the processor includes, or is electrically coupled with, one or more oxide-based three-terminal resistive switching logic devices, in accordance with implementations of the invention. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of the invention, the integrated circuit die of the communication chip includes, or is electrically coupled with, one or more oxide-based three-terminal resistive switching logic devices, in accordance with implementations of the invention.

In further implementations, another component housed within the computing device 1300 may contain an integrated circuit die that includes, or is electrically coupled with, one or more oxide-based three-terminal resistive switching logic devices, in accordance with implementations of the invention.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Additionally, it is to be appreciated that one or more embodiments of the present invention relate generally to the fabrication of microelectronic logic and/or memory. The microelectronic logic and/or memory may be non-volatile, wherein information may be stored even when not powered.

Thus, embodiments of the present invention include oxide-based three-terminal resistive switching logic devices and methods of fabricating oxide-based three-terminal resistive switching logic devices.

In an embodiment, a three-terminal resistive switching logic device includes an active region disposed above a substrate. The active region includes an active oxide material region disposed directly between a metal source region and a metal drain region. The device also includes a gate electrode disposed above the active oxide material region.

In one embodiment, the gate electrode includes a gate dielectric layer disposed on the active oxide material region, a work-function electrode layer disposed on the gate dielectric layer, and a gate contact disposed on the work-function electrode layer.

In one embodiment, the three-terminal resistive switching logic device further includes a source contact electrically connected to the metal source region. A drain contact is electrically connected to the metal drain region.

In one embodiment, the active oxide material region is composed of a conductive oxide material.

In one embodiment, the conductive oxide material is an anionic-based conductive oxide material such as, but not limited to, an oxide of tungsten (W), an oxide of vanadium (V), an oxide of chromium (Cr), or an oxide of iridium (Ir).

In one embodiment, the conductive oxide material is a cationic-based conductive oxide material such as, but not limited to, $LiMnO_2$, $Li_4TiO_{12}$, $LiNiO_2$, $LiNbO_3$, $Li_3N{:}H$, $LiTiS_2$, Na β-alumina, AgI, $RbAg_4I_5$, or $AgGeAsS_3$.

In one embodiment, the metal source region and the metal drain region are composed of a metal such as, but not limited to, palladium (Pd), tungsten (W) or platinum (Pt).

In an embodiment, a three-terminal resistive switching logic device includes an active region disposed above a substrate. The active region includes a first active oxide material region spaced apart from a second oxide material region. The device also includes metal input regions disposed on either side of the first and second active oxide material regions. A metal output region is disposed between the first and second active oxide material regions.

In one embodiment, the three-terminal resistive switching logic device further includes input terminals electrically coupled to the metal input regions. An output terminal is electrically connected to the metal output region.

In one embodiment, the first active oxide material region and the second oxide material region are composed of a conductive oxide material.

In one embodiment, the conductive oxide material is an anionic-based conductive oxide material such as, but not limited to, an oxide of tungsten (W), an oxide of vanadium (V), an oxide of chromium (Cr), or and oxide of iridium (Ir).

In one embodiment, the conductive oxide material is a cationic-based conductive oxide material such as, but not limited to, $LiMnO_2$, $Li_4TiO_{12}$, $LiNiO_2$, $LiNbO_3$, $Li_3N{:}H$, $LiTiS_2$, Na β-alumina, AgI, $RbAg_4I_5$, or $AgGeAsS_3$.

In one embodiment, the metal input regions and the metal output region are composed of a metal such as, but not limited to palladium (Pd), tungsten (W) or platinum (Pt).

In an embodiment, a three-terminal resistive switching logic device includes a first vertical active region disposed above a first metal line, the first vertical active region including a first portion of a metal output region disposed on a first active oxide material region disposed on a first metal input region disposed on the first metal line. A second vertical active region is disposed above a second metal line co-planar with the first metal line, the second vertical active region including a second portion of the metal output region disposed on a second active oxide material region disposed on a second metal input region disposed on the second metal line. A third metal line is disposed on and electrically connects the first and second portions of the metal output region.

In one embodiment, the first active oxide material region and the second oxide material region are composed of a conductive oxide material.

In one embodiment, the conductive oxide material is an anionic-based conductive oxide material such as, but not limited to, an oxide of tungsten (W), an oxide of vanadium (V), an oxide of chromium (Cr), or and oxide of iridium (Ir).

In one embodiment, the conductive oxide material is a cationic-based conductive oxide material such as, but not limited to, $LiMnO_2$, $Li_4TiO_{12}$, $LiNiO_2$, $LiNbO_3$, $Li_3N{:}H$, $LiTiS_2$, Na β-alumina, AgI, $RbAg_4I_5$, or $AgGeAsS_3$.

In one embodiment, the first and second metal input regions and the first and second portions of the metal output region are composed of a metal such as, but not limited to palladium (Pd), tungsten (W) or platinum (Pt).

In an embodiment, a three-terminal resistive switching logic device includes a first vertical active region disposed above a first metal line, the first vertical active region including a first portion of a metal output region disposed on a first active oxide material region disposed on a first metal input region disposed on the first metal line. A second metal line is disposed on the first portion of the metal output region. A second vertical active region is disposed above the second metal line, the second vertical active region including a second metal input region disposed on a second active oxide material region disposed on a second portion of the metal output region disposed on the second metal line. A third metal line is disposed on the second metal input region.

In one embodiment, the first active oxide material region and the second oxide material region are composed of a conductive oxide material.

In one embodiment, the conductive oxide material is an anionic-based conductive oxide material such as, but not limited to, an oxide of tungsten (W), an oxide of vanadium (V), an oxide of chromium (Cr), or and oxide of iridium (Ir).

In one embodiment, the conductive oxide material is a cationic-based conductive oxide material such as, but not limited to, $LiMnO_2$, $Li_4TiO_{12}$, $LiNiO_2$, $LiNbO_3$, $Li_3N{:}H$, $LiTiS_2$, Na β-alumina, AgI, $RbAg_4I_5$, or $AgGeAsS_3$.

In one embodiment, the first and second metal input regions and the first and second portions of the metal output region are composed of a metal such as, but not limited to palladium (Pd), tungsten (W) or platinum (Pt).

What is claimed is:

1. A three-terminal resistive switching logic device, comprising:
   an active region disposed above a substrate, the active region comprising an active oxide material region disposed directly between a metal source region and a metal drain region, wherein the active oxide material region comprises a cationic-based conductive oxide material selected from the group consisting of Li4TiO12, Na β-alumina, and AgGeAsS3 and a gate electrode disposed above the active oxide material region.

2. The three-terminal resistive switching logic device of claim 1, wherein the gate electrode comprises a gate dielectric layer disposed on the active oxide material region, a work-function electrode layer disposed on the gate dielectric layer, and a gate contact disposed on the work-function electrode layer.

3. The three-terminal resistive switching logic device of claim 1, further comprising:
a source contact electrically connected to the metal source region; and
a drain contact electrically connected to the metal drain region.

4. The three-terminal resistive switching logic device of claim 1, wherein the metal source region and the metal drain region comprise a metal selected from the group consisting of palladium (Pd), tungsten (W) and platinum (Pt).

5. A three-terminal resistive switching logic device, comprising:
an active region disposed above a substrate, the active region comprising a first active oxide material region spaced apart from a second oxide material region,
wherein the first active oxide material region and the second oxide material region comprise a cationic-based conductive oxide material selected from the group consisting of Li4TiO12, Na β-alumina, and AgGe-AsS3;
metal input regions disposed on either side of the first and second active oxide material regions; and
a metal output region disposed between the first and second active oxide material regions.

6. The three-terminal resistive switching logic device of claim 5, further comprising:
input terminals electrically connected to the metal input regions; and
an output terminal electrically connected to the metal output region.

7. The three-terminal resistive switching logic device of claim 5, wherein the metal input regions and the metal output region comprise a metal selected from the group consisting of palladium (Pd), tungsten (W) and platinum (Pt).

8. A three-terminal resistive switching logic device, comprising:
a first vertical active region disposed above a first metal line, the first vertical active region comprising a first portion of a metal output region disposed on a first active oxide material region disposed on a first metal input region disposed on the first metal line;
a second vertical active region disposed above a second metal line co-planar with the first metal line, the second vertical active region comprising a second portion of the metal output region disposed on a second active oxide material region disposed on a second metal input region disposed on the second metal line,
wherein the first active oxide material region and the second oxide material region comprise a cationic-based conductive oxide material selected from the group consisting of Li4TiO12, Na β-alumina, and AgGe-AsS3; and
a third metal line disposed on and electrically connecting the first and second portions of the metal output region.

9. The three-terminal resistive switching logic device of claim 8, wherein the first and second metal input regions and the first and second portions of the metal output region comprise a metal selected from the group consisting of palladium (Pd), tungsten (W) and platinum (Pt).

10. A three-terminal resistive switching logic device, comprising: a first vertical active region disposed above a first metal line, the first vertical active region comprising a first portion of a metal output region disposed on a first active oxide material region disposed on a first metal input region disposed on the first metal line;
a second metal line disposed on the first portion of the metal output region; a second vertical active region disposed above the second metal line, the second vertical active region comprising a second metal input region disposed on a second active oxide material region disposed on a second portion of the metal output region disposed on the second metal line,
wherein the first active oxide material region and the second oxide material region comprise a cationic-based conductive oxide material selected from the group consisting of Li4TiO12, Na β-alumina, and AgGe-AsS3; and a third metal line disposed on the second metal input region.

11. The three-terminal resistive switching logic device of claim 10, wherein the first and second metal input regions and the first and second portions of the metal output region comprise a metal selected from the group consisting of palladium (Pd), tungsten (W) and platinum (Pt).

* * * * *